United States Patent
Van Herpen (10) Patent No.: US 7,145,631 B2
(45) Date of Patent: Dec. 5, 2006

(54) LITHOGRAPHIC APPARATUS, ILLUMINATION SYSTEM AND METHOD FOR MITIGATING DEBRIS PARTICLES

(75) Inventor: Maarten Marinus Johannes Wilhelmus Van Herpen, Heesch (NL)

(73) Assignee: ASML Netherlands B.V., Veldhoven (NL)

( * ) Notice: Subject to any disclaimer, the term of this patent is extended or adjusted under 35 U.S.C. 154(b) by 11 days.

(21) Appl. No.: 11/020,555

(22) Filed: Dec. 27, 2004

(65) Prior Publication Data
US 2006/0138361 A1   Jun. 29, 2006

(51) Int. Cl.
G03B 27/52 (2006.01)
H01J 65/04 (2006.01)

(52) U.S. Cl. ............ 355/30; 250/461.1; 250/504 R; 250/559.4; 355/53

(58) Field of Classification Search .......... 250/504 R, 250/492.2; 355/30, 53
See application file for complete search history.

(56) References Cited

U.S. PATENT DOCUMENTS 4,408,338 A   10/1983 Grobman

| | | | |
|---|---|---|---|
| 2002/0090054 A1* | 7/2002 | Sogard | 378/119 |
| 2005/0121624 A1* | 6/2005 | Ivanov et al. | 250/492.2 |
| 2005/0122491 A1* | 6/2005 | Bakker et al. | 355/30 |
| 2005/0199829 A1* | 9/2005 | Partlo et al. | 250/504 R |
| 2006/0012761 A1* | 1/2006 | Bakker et al. | 355/30 |

FOREIGN PATENT DOCUMENTS

| WO | WO 99/42904 | 8/1999 |
|---|---|---|
| WO | WO 03/034153 A2 | 4/2003 |
| WO | WO 03/034153 A3 | 4/2003 |

\* cited by examiner

*Primary Examiner*—Nikita Wells
*Assistant Examiner*—Johnnie L Smith, II
(74) *Attorney, Agent, or Firm*—Pillsbury Winthrop Shaw Pittman LLP (57) ABSTRACT

A lithographic apparatus includes a source for generating radiation bursts with a predetermined frequency, an illumination system for conditioning the radiation, a patterning device for patterning the radiation, and a projection system for projecting the patterned radiation onto a substrate. The illumination system includes a debris mitigating system for mitigating debris particles released with the generation of the radiation. The debris mitigating system is arranged to apply on the basis of the predetermined frequency a dynamically applicable condition to which the debris particles are exposed.

33 Claims, 5 Drawing Sheets

LITHOGRAPHIC APPARATUS, ILLUMINATION SYSTEM AND METHOD FOR MITIGATING DEBRIS PARTICLES

FIELD

The present invention relates to a lithographic apparatus, an illumination system and a method for mitigating debris particles.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction), while synchronously scanning the substrate parallel or anti-parallel to this direction. It is also possible to transfer the pattern from the patterning device to the substrate by imprinting the pattern onto the substrate.

In a lithographic apparatus, the size of features that can be imaged onto the substrate is limited by the wavelength of the projection radiation. To produce integrated circuits with a higher density of devices, and hence higher operating speeds, it is desirable to image smaller features. While most current lithographic projection apparatus employ ultraviolet light generated by mercury lamps or excimer lasers, it has been proposed to use shorter wavelength radiation, in the range of 5 to 20 nm, in particular around 13 nm. Such radiation is termed extreme ultra violet (EUV) or soft X-ray and possible sources include, for example, laser produced plasma sources, discharge plasma sources, or synchrotron radiation from electron storage rings. These types of radiation require that the beam path in the apparatus be evacuated to avoid beam scatter and absorption. Because there is no known material suitable for making a refractive optical element for EUV radiation, EUV lithographic apparatus must use mirrors in the radiation (illumination) and projection systems. Even multilayer mirrors for EUV radiation have relatively low reflectivities and are highly susceptible to contamination, further reducing their reflectivity and hence the throughput of the apparatus. This may impose further specifications on the vacuum level to be maintained and may necessitate especially that hydrocarbon partial pressures be kept very low.

In a typical discharge plasma source, plasma is formed by an electrical discharge. The plasma may then be caused to compress so that it becomes highly ionized and reaches a very high temperature, thereby causing the emission of EUV radiation. The material used to produce the EUV radiation is typically xenon gas or lithium vapor, although other gases or vapors such as krypton gas or tin or water vapor may also be used. However, these gases and vapors may have a relatively high absorption of radiation within the EUV range and/or may be damaging to optics further downstream of the projection beam and their presence should therefore be minimized in the remainder of the lithographic apparatus. A discharge plasma source is disclosed, for example, in U.S. Pat. No. 5,023,897 and U.S. Pat. No. 5,504,795, both of which are incorporated herein by reference.

In a laser produced plasma source, a jet of, for example, (clustered) xenon may be ejected from a nozzle, for example, from an ink-jet like nozzle as droplets or thin wire. At some distance from the nozzle, the jet is irradiated with a laser pulse of a suitable wavelength for creating a plasma that subsequently will radiate EUV radiation. Other materials, such as water droplets, ice particles, lithium or tin, etc., may also be ejected from a nozzle and be used for EUV generation. In an alternative laser-produced plasma source, an extended solid (or liquid) material is irradiated to create a plasma for EUV radiation. Laser produced plasma sources are, for example, disclosed in U.S. Pat. No. 5,459,771, U.S. Pat. No. 4,872,189, and U.S. Pat. No. 5,577,092, all of which are incorporated herein by reference.

During generation of EUV radiation, particles are released. These particles, hereinafter referred to as debris particles, include ions, atoms, molecules, and small droplets. These particles should to be mitigated, in the sense that a possible detrimental effect of these particles on the performance and/or the lifetime of the lithographic apparatus and in particular the illumination and projection system, be minimized.

U.S. Pat. No. 4,408,338 discloses a physical barrier for blocking debris particles as discharged from any pulsed electromagnetic radiation source, from following a path along which the electromagnetic radiation propagates. The physical barrier includes a shutter positioned in the path of the radiation at a distance sufficiently far from the source of the radiation such that an emitted pulse of the radiation and the debris particles discharged simultaneously with the pulse become spatially separated from each other and arrive at the shutter at different times due to the inherent difference in propagation speed of the debris and pulse. Operation of the shutter is synchronized with generation of the electromagnetic pulses such that the electric magnetic pulse encounters an open shutter while the slower travelling debris launched simultaneously with the pulse encounters a closed shutter.

SUMMARY

It is desirable to provide a lithographic apparatus, an illumination system and a method for mitigating debris particles, in which the debris particles are mitigated in correspondence with the severity of the detrimental effect the debris particles may cause.

According to an aspect of the invention, there is provided a lithographic apparatus that includes a source for generating radiation bursts with a predetermined frequency, an illumination system for conditioning the radiation, a patterning device for patterning the radiation, and a projection system for projecting the patterned radiation onto a substrate. The illumination system includes a debris mitigating system for mitigating debris particles released with the generation of the radiation. The debris mitigating system is arranged to apply on the basis of the predetermined frequency a dynamically applicable condition to which the debris particles are exposed.

According to an aspect of the invention, there is provided an illumination system configured to condition radiation in a lithographic apparatus. The illumination system includes a debris mitigating system for mitigating debris particles that are released when the radiation is generated. The debris mitigating system is arranged to provide a dynamically applicable condition to which the debris particles are exposed on the basis of a predetermined frequency with which a source generates bursts of the radiation to be conditioned by the illumination system.

According to an aspect of the invention, there is provided a method for mitigating debris particles released with the generation of radiation for use in lithography. The method includes applying a dynamic condition for mitigating the debris particles on the basis of a predetermined frequency with which bursts of the radiation are generated.

As according to each of the above-mentioned aspects of the invention, a dynamically applicable condition is applied for mitigating the debris particles, i.e. a condition of which the "intensity" is variable in time, so that it is possible to mitigate the debris particles, for example, in correspondence with the velocity of the debris particles that need to be mitigated. The detrimental effects causable by high speed particles may be much more severe than the detrimental effects causable by relatively low speed particles. The "intensity" of the condition for mitigating debris particles may be applied at a certain position with respect to the different times at which slow particles and fast particles pass that certain point. In short, the debris mitigating system according to the invention may work in correspondence with a debris particle velocity distribution.

In general, the application of a dynamically applicable condition may allow for optimizing the mitigation of debris particles and/or may allow for optimizing the transmission of (EUV) radiation.

It furthermore allows for a much more flexible response of the debris mitigating system in cases where the frequency of the source is variable, as compared to the physical barrier described in U.S. Pat. No. 4,408,338.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
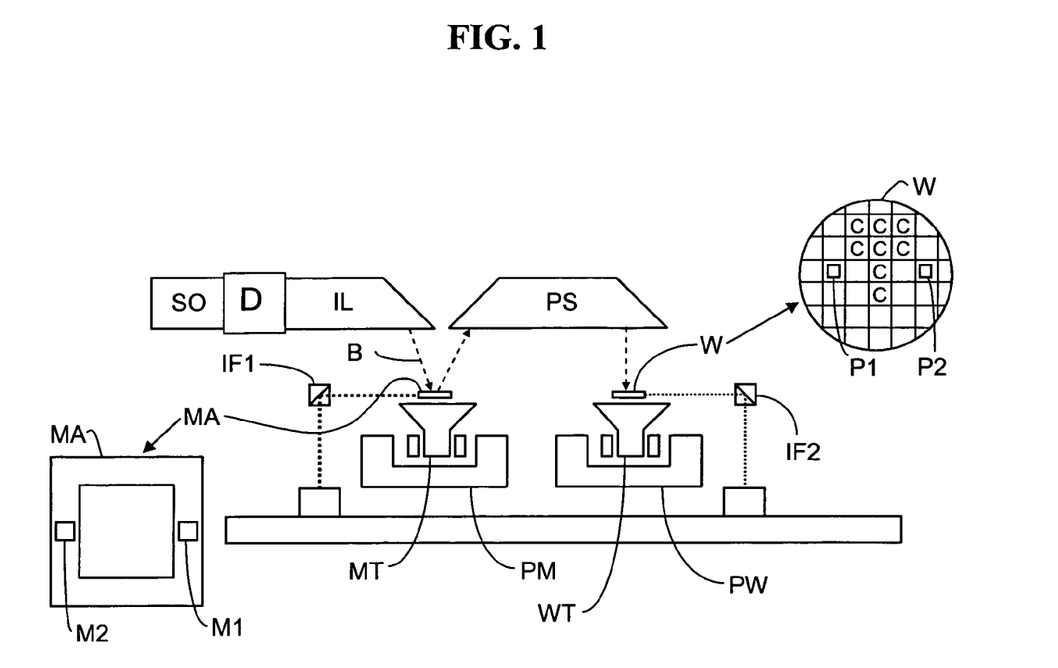
FIG. 1 schematically depicts a lithographic apparatus according to an embodiment of the invention.

FIG. 1 schematically depicts a lithographic apparatus according to an embodiment of the invention. The apparatus includes an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. It holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example, with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. A debris mitigating system D for mitigating debris particles that are released when radiation is generated may be placed in a path along which the radiation propagates from the source SO to the illuminator IL. The debris mitigating system D may be part of the source, part of the illumination system IL, or part of the radiation system. Such a debris mitigating system D, and the working thereof will be described in more detail below. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases, the source may be an integral part of the lithographic apparatus, for example, when the source is a mercury lamp. The source SO and the illuminator IL, together with the beam delivery system, if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus may be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned, while a pattern imparted to the radiation beam is projected onto a target portion C. In this mode, generally, a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
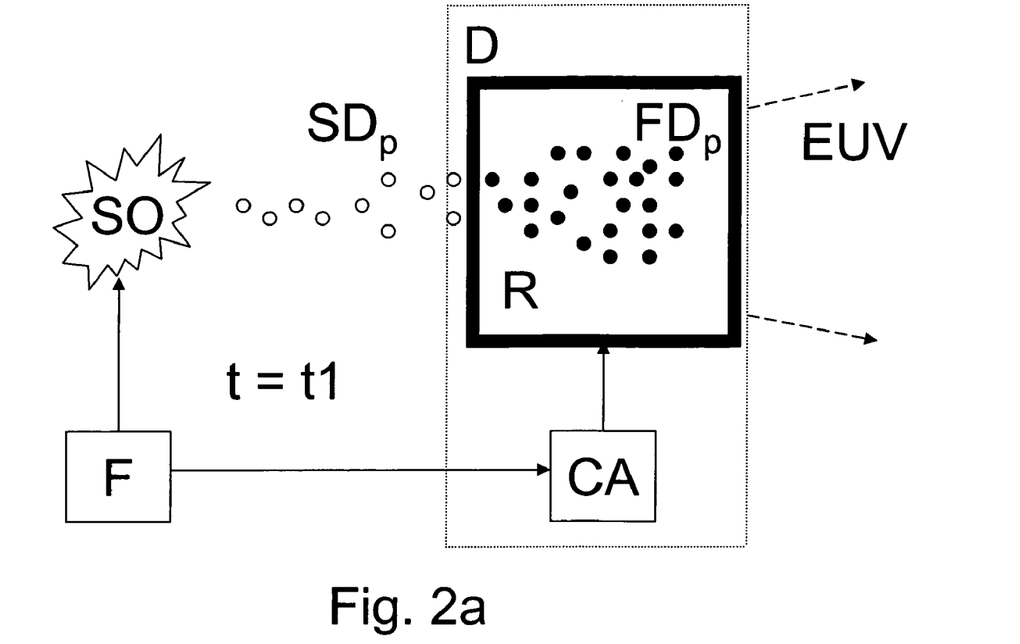
FIG. 2a schematically depicts a part of the lithographic apparatus of FIG. 1 according to an embodiment of the invention at a first moment in time.
Figure 2B:
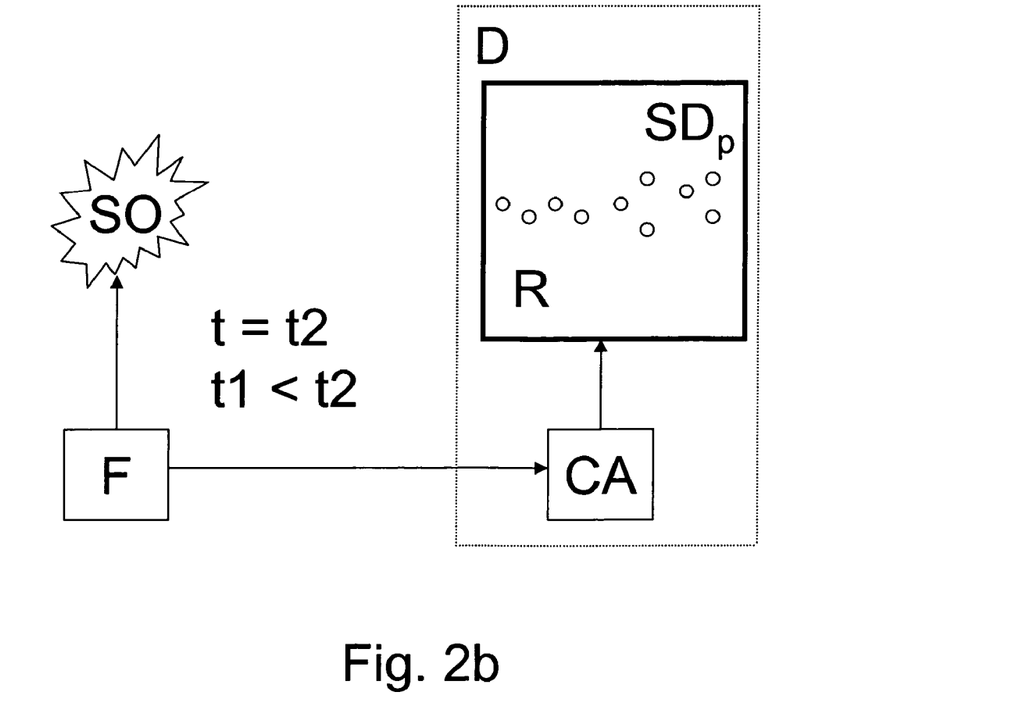
FIG. 2b schematically depicts the part of the lithographic apparatus of FIG. 2a at a second moment, which is after the first moment in time.

FIG. 2 shows a part of a lithographic apparatus according to the invention. This part depicts schematically a part of the illumination system IL. The illumination system is in general configured to condition a radiation beam; in the examples discussed here and below, a beam of EUV radiation. The illumination system includes a source SO for generating—with a predetermined frequency—radiation bursts. The illumination system further includes a debris mitigating system D for mitigating debris particles $D_p$ that are released with the generation of the radiation. The debris mitigating system D is arranged to apply on the basis of the predetermined frequency a dynamically applicable condition to which the debris particles $D_p$ are exposed. A dynamically applicable condition within the context of this specification concerns a physical condition that is variable in time, either passively or actively. In particular, the presence of a shutter is not to be understood as a physical condition that is variable in time, as such a shutter is either physically present or not physically present. Often, no development is possible in the physical presence of a shutter. In contrast, a dynamically applicable condition may show a development.

The system shown in FIG. 1 may, for the purpose of applying a dynamically applicable condition, include a frequency generator F, or a frequency monitor F. In any event, the frequency, generally a predetermined frequency, with which the source generates radiation bursts, forms the basis on which the debris mitigating system D provides the dynamically applicable condition for mitigating debris particles $D_p$. For the purpose of applying such a condition, each of the exemplary embodiments shown in FIGS. 2a, 2b and 8 includes a condition applicator CA. The condition applicator CA is informed with which frequency the source generates radiation bursts, so that the condition applicator may apply the dynamically applicable condition with the same frequency.

A dynamic aspect of the debris mitigating system D is schematically visualized in FIG. 2a and FIG. 2b. When a burst of radiation is generated by the source SO, radiation, in this case EUV radiation, propagates away from the source SO with the speed of light. This pulse of light is followed within, for example, a few hundred nanoseconds by a pulse of ions, atoms and/or other debris particles such as molecules and very small droplets. As the debris particles travel at a speed far below the speed of light, the time required for the debris particles to travel a certain distance from the source SO will be much longer, as compared to the travel time of the EUV radiation. At a certain distance from the source, the situation, at a moment t=t1, will be as shown in FIG. 2a. That is, the EUV radiation has left a particular region R, while fast debris particles $FD_p$ have entered that particular region R. The fast debris particles are indicated by black dots. The debris mitigating system D will apply the dynamically applicable condition to such an extend that the fast debris particles $FD_p$ are mitigated. Examples of ways of mitigating the particles are discussed below.

The situation a little later, at a moment t=t2(t1<t2), is shown in FIG. 2b. The fast particles $FD_p$ have been mitigated and are for that reason no longer shown. The slower debris particles $SD_p$ have reached the region R. The debris mitigating system D will apply the dynamically applicable condition for mitigating debris particles to a much lesser extent as compared to the condition to mitigate the fast debris particles $FD_p$. The "intensity" of the condition present in region R is schematically indicated by the thickness of the lines that schematically define in FIG. 2a and FIG. 2b region R. It is, for example, possible to mitigate fast ions in a very different way from the way slow particles, such as molecules, are mitigated. Such embodiments will be described in more detail below.

It is should be appreciated that the debris mitigating system D shown in FIG. 2a and FIG. 2b is arranged to apply a condition for mitigating debris particles $D_p$ such that when relatively fast debris particles $FD_p$ are present in a region R of a path extending from the source SO, the condition for mitigating is enforced in that region R. When relatively slow debris particles $SD_p$, or no debris particles are present in that region R, the condition for mitigating is weakened or not present in that region R.

It is, however, also possible that the condition is also dynamically applicable with respect to positions in the path extending from the source SO.

Figure 3:
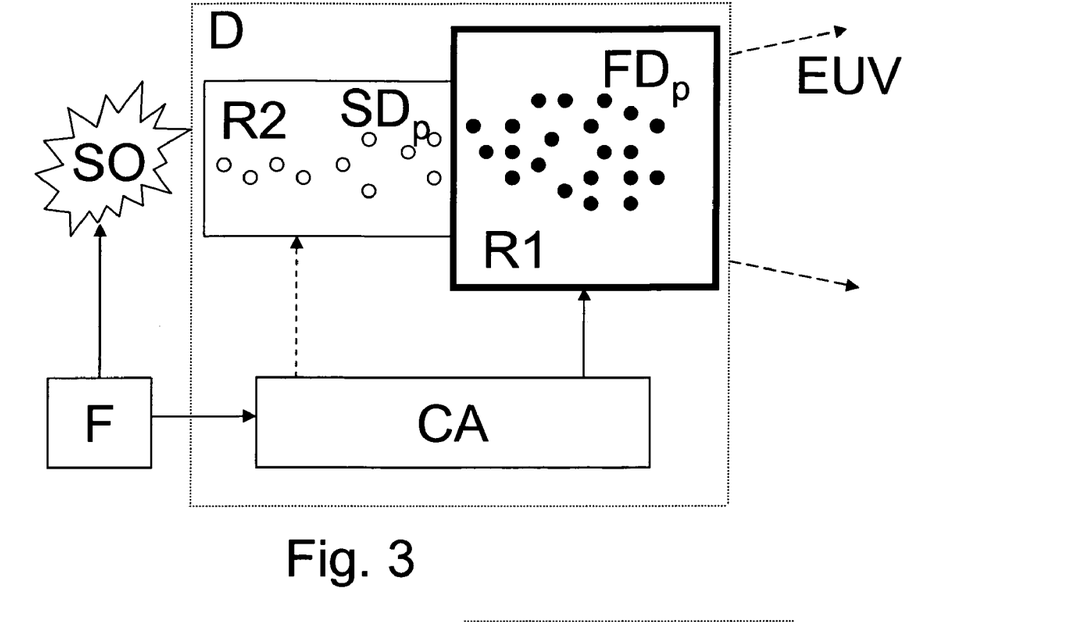
FIG. 3 schematically depicts a part of the lithographic apparatus of FIG. 1 according to an embodiment of the invention.

FIG. 3 shows a debris mitigating system D that is arranged to apply the condition for mitigating debris particles $D_p$ such that when relatively fast debris particles $FD_p$ are present in a first region R1 of a path extending from the source SO, the condition for mitigating is enforced in that region R1. When relatively slow debris particles $SD_p$, or no debris particles are present in a second region R2 of that path, the condition for mitigating in that second region R2 is weakened or not present. Again, the thickness of the lines schematically defining the first region R1 and the second region R2 schematically represent the intensity of the condition for mitigating debris particles. Again, the black dots indicate the fast debris particles $FD_p$ and the open dots indicate the slow debris particles $SD_p$. In this embodiment, the condition in region R1 and the condition in region R2 will differ, but are initially applied at the same time. The "intensity" of the condition applied in region R1 may diminish to the level of the intensity of the condition applied in region R2, so that particles that have not successfully been mitigated in region R2 may still be mitigated in region R1, without the need for applying constantly the high "intensity" of the condition in region R1.

Figure 4:
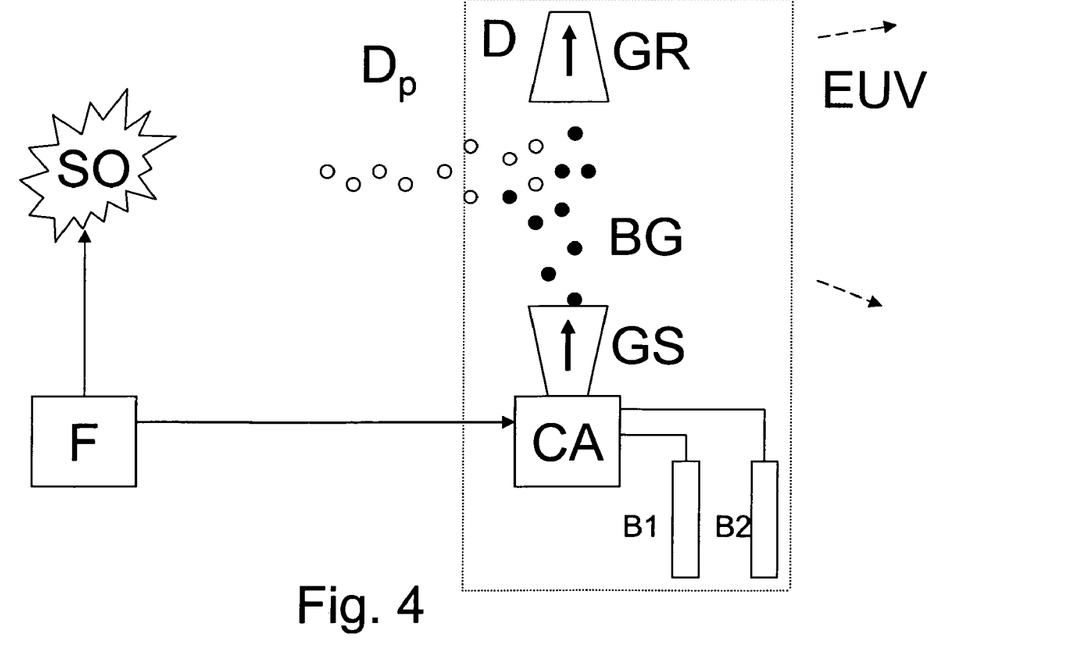
FIG. 4 schematically depicts a part of the lithographic apparatus of FIG. 1 according to an embodiment of the invention.

FIG. 4 shows an embodiment in which the dynamically applicable condition includes the presence of a buffer gas BG. In FIG. 4, the black dots refer to buffer gas particles; the open dots refer to debris particles. For this purpose, the debris mitigating system D includes a gas supply GS and possibly a gas exhaust GR. This embodiment may have the advantage that the pressure of the buffer gas may be minimized when EUV light passes. On the other hand, the pressure may be maximized when the fastest debris particles $FD_p$ pass the debris mitigating system D. Another possible advantage of this embodiment is that the overall pressure, in particular close to the source, may be kept low, as the debris mitigating system may be arranged to supply buffer gas in correspondence with the need to mitigate and the presence of debris particles. An overdose of buffer gas may be avoided. This lower overall pressure, on its turn, is beneficial to the transmission of the (EUV) radiation. The buffer gas BG may significantly reduce the velocity of fast neutrals and ions through collisions with the buffer gas particles. By minimizing the pressure when radiation passes the debris mitigating system, the EUV transmission may be optimized, i.e. less EUV radiation may be absorbed by the buffer gas BG, as compared to a situation in which the radiation propagates through the buffer gas applied at high pressure. It may also be possible to use a type of buffer gas that is more suitable for mitigating debris particles $D_p$ even though its absorption of EUV radiation is relatively high. After all, when the buffer gas is applied, the radiation has already passed the debris mitigating system D.

It should be appreciated that although the source generates radiation bursts with a frequency that is equal to the frequency with which the dynamically applicable condition is applied, it is most likely that the generation of the radiation burst and the application of the dynamically applicable condition are out of phase, i.e. not at the same time. In fact, it may well be that the supply of buffer gas may occur well before the generation of a radiation burst. As will be appreciated from likely differences between the speed of light and the speed of debris particles, it may be the case that the moment the buffer gas has reached the region where debris particles need to be mitigated, the radiation has already passed that region. A person skilled in the art should be able to determine via, for example, routine calculations and/or routine experiments how much the initiation of the application of the dynamic condition, and the generation of a radiation burst should be out of phase to optimally mitigate the debris particles and/or to minimize interference with the radiation.

As shown in FIG. 4, it is also possible that the dynamically applicable condition includes a composition of a buffer gas. It is, for example, possible that, initially, gas molecules are supplied that have a relatively high weight, thereby efficiently slowing down fast neutrals and or ions, and that a little later, gas molecules are supplied that have a relatively low weight, but are still capable of slowing slow neutrals and/or ions. These low weight gas molecules may, for example, be less likely to absorb EUV radiation, so that gas that is still around when the next radiation burst is generated is unlikely to absorb much EUV radiation. The debris mitigating system D, as shown in FIG. 4, includes for this purpose a first bottle B1 containing, for example, gas of which the gas molecules have a relatively high weight, and a second bottle B2 containing gas of which the gas molecules have a relatively low weight.

Figure 5:
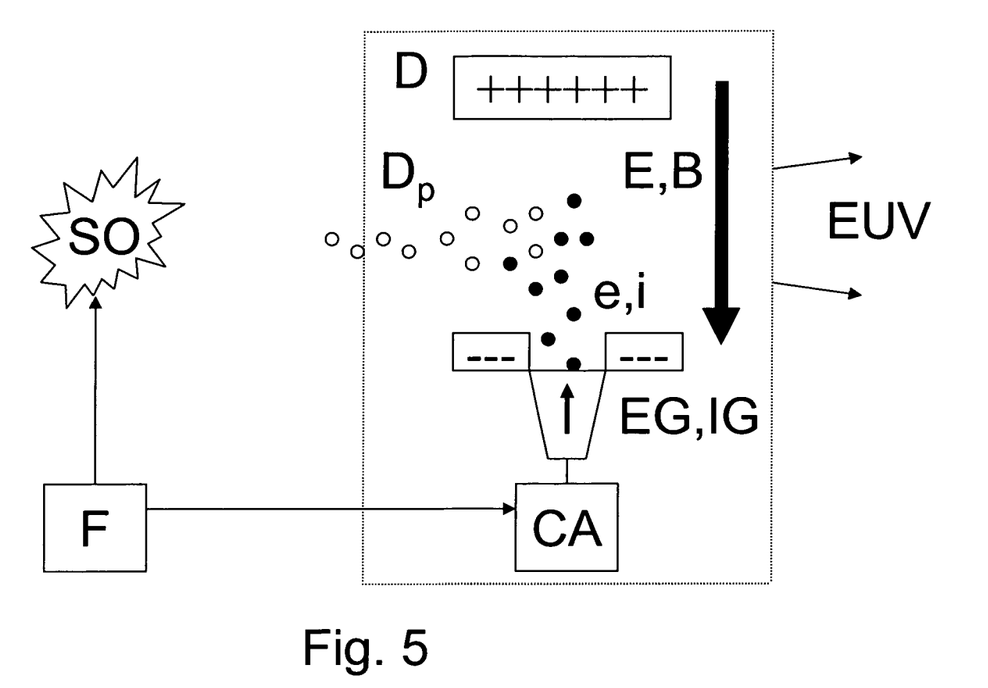
FIG. 5 schematically depicts a part of the lithographic apparatus of FIG. 1 according to an embodiment of the invention.

In an embodiment of a debris mitigating system as part of a lithographic apparatus according to the invention, the dynamically applicable condition may include the presence of conditions due to which the debris particles are ionized. It is, for example, possible that the debris mitigating system D includes an electron gun EG, or an ion gun IG, for generating an electron beam or ion beam, respectively, which may interact with the debris particles $D_p$ and ionize the debris particles $D_p$. In FIG. 5, the black dots refer to either electrons or to ions; the open dots are debris particles. This allows for deflecting the course of the debris particles under the influence of an electric field E or a magnetic field B. It should be appreciated that these conditions, i.e. the presence of an electric or of an magnetic field, are also easily dynamically applicable.

Figure 6:
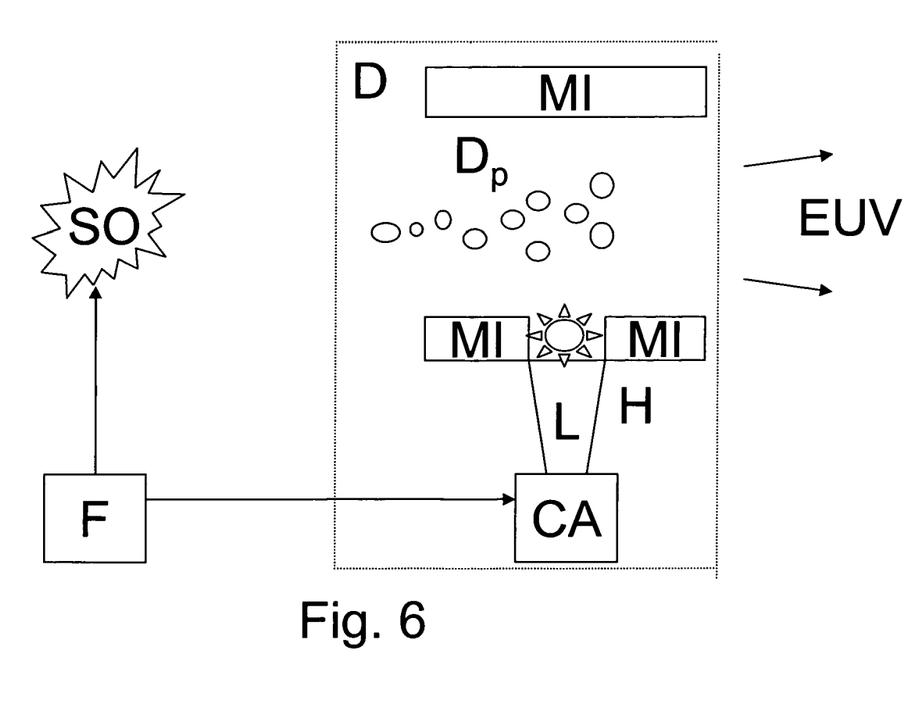
FIG. 6 schematically depicts a part of the lithographic apparatus of FIG. 1 according to an embodiment of the invention.

FIG. 6 shows an embodiment according to the invention wherein the dynamically applicable condition includes the temperature of the debris particles. For this purpose the debris mitigating system D, as shown in FIG. 6, may include a heater H, which may include a lamp L for providing light that heats up the debris particles $D_p$. The lamp may be, for example, a flash lamp, an I-line lamp, or a laser. It is possible to either photo ionize debris particles and mitigate the debris particles further using, for example, an electric or magnetic field (not shown in FIG. 6), or evaporate relatively small droplets such that these particles break apart into smaller particles that are more easily mitigated or much less detrimental to the lithographic apparatus. The debris mitigating system shown in FIG. 6 may include mirrors MI to ensure that the light provided by a lamp L is reflected back to the debris particles $D_p$, and as a result of that is more likely to be absorbed by the debris particles causing either the photo ionization or the evaporation. The power and/or the frequency of the light used for heating the debris particles may be dynamically applied.

Figure 7:
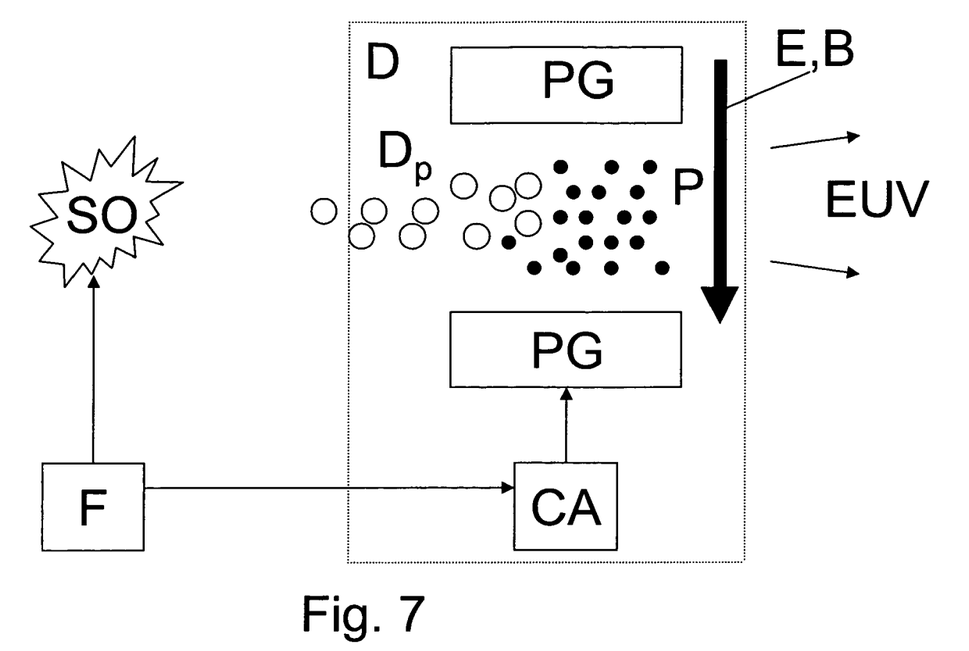
FIG. 7 schematically depicts a part of the lithographic apparatus of FIG. 1 according to an embodiment of the invention.

FIG. 7 shows an embodiment according to the invention in which the dynamically applicable condition includes the presence of conditions for generating a plasma P. For this purpose, the debris mitigating system D shown in FIG. 7 includes a plasma generator PG. When the debris particles are plasmatized, the course of the individual debris particles $D_p$ may again be deflected much easier under the influence of an electric and/or magnetic field. In FIG. 7, the open dots refer to unplasmatized debris particles, while the black dots refer to the plasma particles formed out of the debris particles $D_p$. Again, an electric or magnetic field may be generated to deflect the charged particles from a path into which the radiation propagates away from the source SO.

Figure 8:
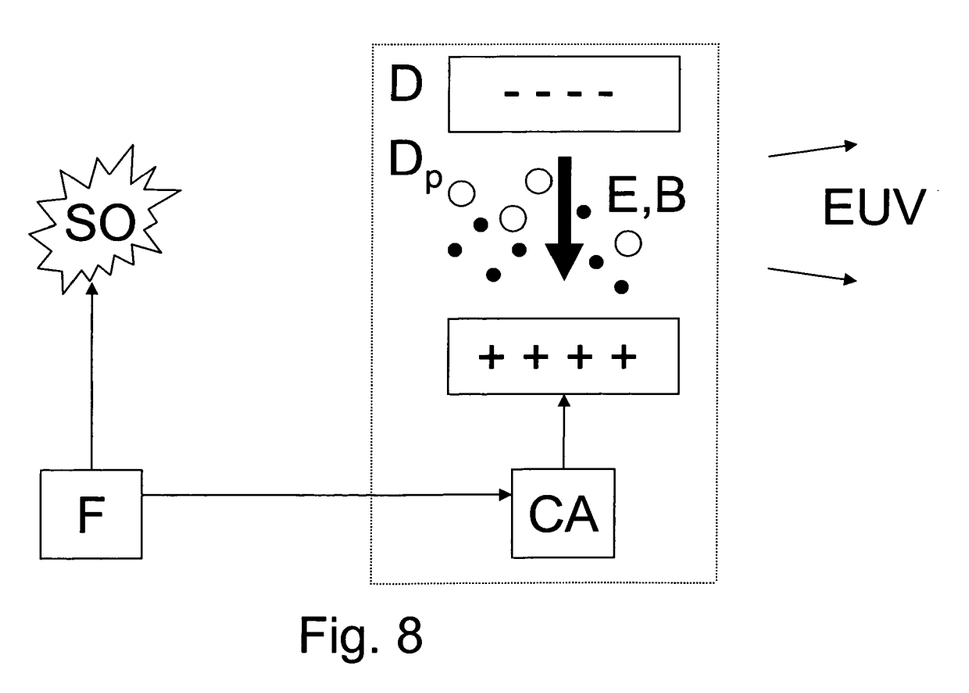
FIG. 8 schematically depicts a part of the lithographic apparatus of FIG. 1 according to an embodiment of the invention.

Finally, FIG. 8 shows an embodiment in which the dynamically applicable condition includes the presence of an electric field E or magnetic field B. In this embodiment the charged debris particles, indicated by small black dots, will be deflected and follow the electric or magnetic field lines, rather than the direction into which the radiation propagates. The electric and magnetic field may be applied in a well known manner by using oppositely charged electrodes or oppositely charged permanent magnets, respectively, or applying electromagnets.

The invention is by no means limited to the embodiment shown in the figures. It is of course possible to combine embodiments as shown hereinabove. It is, for example, possible to supply a buffer gas and to, for example, photo-ionize that buffer gas in order to provide ions that again ionize the debris particles. Gas particles in general are, as earlier indicated, much easier mitigated under the influence of an electric and/or magnetic field. It should be understood that other conditions, not described in this specification, may also be suitable for a dynamic application in accordance with the invention.

The frequency with which the source generates radiation bursts may be in a range varying from about 250 Hz to about 2 kHz, or higher. It will be clear that the application of "bursts" of buffer gas may be easily generated with a frequency of about 250 Hz. However, when about a 2 kHz frequency is used for generating radiation bursts, the dynamic condition may more easily be applied by, for example, a flash lamp. The skilled person should on the basis of routine considerations apply the type of condition that may be applied with the frequency with which the source generates radiation busts.

It is possible to combine the present invention with the use of a so-called foiltrap, as for example disclosed in International Patent Application Publication No. WO 99/42904 and International Patent Application Publication No. WO 03/034153, both of which are incorporated herein by reference.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example, in order to create a multi-layer IC, so that the term substrate as used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography, a topography in a patterning device defines the pattern created on a substrate. The topography of the patterning device may be pressed into a layer of resist supplied to the substrate, whereupon the resist is cured by applying electromagnetic radiation, heat, pressure, or any combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5–20 nm) and X-rays.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a source for generating radiation bursts with a predetermined frequency;
   an illumination system for conditioning the radiation;
   a patterning device for patterning the radiation; and
   a projection system for projecting the patterned radiation onto a substrate,
   wherein the illumination system comprises a debris mitigating system for mitigating debris particles released with the generation of the radiation, and
   wherein the debris mitigating system is arranged to apply on the basis of the predetermined frequency a dynamically applicable condition to which the debris particles are exposed.

2. A lithographic apparatus according to claim 1, wherein the debris mitigation system is arranged to apply the condition for mitigating debris particles so that when relatively fast debris particles are present in a region of a path extending from the source, the condition for mitigating is enforced in that region, and that when relatively slow or no debris particles are present in that region, the condition for mitigating is weakened or not present in that region.

3. A lithographic apparatus according to claim 1, wherein the condition is also dynamically applicable with respect to positions in a path extending from the source.

4. A lithographic apparatus according to claim 3, wherein the debris mitigation system is arranged to apply the condition for mitigating debris particles so that when relatively fast debris particles are present in a first region of a path extending from the source, the condition for mitigating is enforced in the first region, and that when relatively slow or no debris particles are present in a second region of that path, the condition for mitigating is weakened or not present in the second region.

5. A lithographic apparatus according to claim 1, wherein the debris mitigating system comprises a gas supply for providing a buffer gas, and wherein the presence of the buffer gas is at least part of the dynamically applicable condition.

6. A lithographic apparatus according to claim 5, wherein the gas supply comprises a first gas source comprising gas molecules having a relatively high molecular weight, and a second gas source comprising gas molecules having a relatively low molecular weight, and wherein the composition of the buffer gas is at least part of the dynamically applicable condition.

7. A lithographic apparatus according to claim 1, wherein the debris mitigating system comprises an electron gun or an ion gun for generating an electron beam or an ion beam, respectively, for ionizing the debris particles, and wherein the presence of the electron beam or the ion beam is at least part of the dynamically applicable condition.

8. A lithographic apparatus according to claim 1, wherein the debris mitigating system comprises a heater for heating the debris particles, and wherein the temperature to which the debris particles are subjected is at least part of the dynamically applicable condition.

9. A lithographic apparatus according to claim 1, wherein the debris mitigating system comprises a plasma generator for generating a plasma, and wherein the presence of the plasma is at least part of the dynamically applicable condition.

10. A lithographic apparatus according to claim 1, wherein the debris mitigating system comprises an electric field generator for generating an electric field, and wherein the presence of the electric filed is at least part of the dynamically applicable condition.

11. A lithographic apparatus according to claim 1, wherein the debris mitigating system comprises a magnetic field generator for generating a magnetic field, and wherein the presence of the magnetic filed is at least part of the dynamically applicable condition.

12. An illumination system configured to condition radiation in a lithographic apparatus, the illumination system comprising a debris mitigating system for mitigating debris particles that are released when the radiation is generated, wherein the debris mitigating system is arranged to provide a dynamically applicable condition to which the debris particles are exposed on the basis of a predetermined frequency with which a source generates bursts of the radiation to be conditioned by the illumination system.

13. An illumination system according to claim 12, wherein the debris mitigation system is arranged to apply the condition for mitigating debris particles so that when relatively fast debris particles are present in a region of a path extending from the source, the condition for mitigating is enforced in that region, and that when relatively slow or no debris particles are present in that region, the condition for mitigating is weakened or not present in that region.

14. An illumination system according to claim 12, wherein the condition is also dynamically applicable with respect to positions in a path extending from the source.

15. An illumination system according to claim 14, wherein the debris mitigation system is arranged to apply the condition for mitigating debris particles so that when relatively fast debris particles are present in a first region of a path extending from the source, the condition for mitigating is enforced in the first region, and that when relatively slow or no debris particles are present in a second region of that path, the condition for mitigating is weakened or not present in the second region.

16. An illumination system according to claim 12, wherein the debris mitigating system comprises a gas supply for providing a buffer gas, and wherein the presence of the buffer gas is at least part of the dynamically applicable condition.

17. An illumination system according to claim 16, wherein the gas supply comprises a first gas source comprising gas molecules having a relatively high molecular weight, and a second gas source comprising gas molecules having a relatively low molecular weight, and wherein the composition of the buffer gas is at least part of the dynamically applicable condition.

18. An illumination system according to claim 12, wherein the debris mitigating system comprises an electron gun or an ion gun for generating an electron beam or an ion beam, respectively, for ionizing the debris particles, and wherein the presence of the electron beam or the ion beam is at least part of the dynamically applicable condition.

19. An illumination system according to claim 12, wherein the debris mitigating system comprises a heater for heating the debris particles, and wherein the temperature to which the debris particles are subjected is at least part of the dynamically applicable condition.

20. An illumination system according to claim 12, wherein the debris mitigating system comprises a plasma generator for generating a plasma, and wherein the presence of the plasma is at least part of the dynamically applicable condition.

21. An illumination system according to claim 12, wherein the debris mitigating system comprises an electric field generator for generating an electric field, and wherein the presence of the electric filed is at least part of the dynamically applicable condition.

22. An illumination system according to claim 12, wherein the debris mitigating system comprises a magnetic field generator for generating a magnetic field, and wherein the presence of the magnetic filed is at least part of the dynamically applicable condition.

23. A method for mitigating debris particles released with the generation of radiation for use in lithography, wherein the method comprises applying a dynamic condition for mitigating the debris particles on the basis of a predetermined frequency with which bursts of the radiation are generated.

24. A method according to claim 23, wherein said applying comprises applying the condition for mitigating debris particles so that when relatively fast debris particles are present in a region of a path along which radiation propagates or has propagated, the condition for mitigating is enforced in that region, and that when relatively slow or no debris particles are present in that region, the condition for mitigating is weakened or not present in that region.

25. A method according to claim 23, wherein said applying comprises applying the condition also dynamically with respect to positions in a path along which radiation propagates or has propagated.

26. A method according to claim 25, wherein said applying comprises applying the condition for mitigating debris particles so that when relatively fast debris particles are present in a first region of a path along which radiation propagates or has propagated, the condition for mitigating is enforced in the first region, and that when relatively slow or no debris particles are present in a second region of that path, the condition for mitigating is weakened or not present in the second region.

27. A method according to claim 23, wherein said applying the condition comprises supplying a buffer gas to the debris particles with a gas supply.

28. A method according to claim 27, wherein said applying the condition comprises supplying the buffer gas with a dynamically changing composition.

29. A method according to claim 23, wherein said applying the condition comprises generating an electron beam or an ion beam, respectively, for ionizing the debris particles with an electron gun or an ion gun, respectively.

30. A method according to claim 23, wherein said applying the condition comprises heating the debris particles with a heater.

31. A method according to claim 23, wherein said applying the condition comprises generating a plasma with a plasma generator.

32. A method according to claim 23, wherein said applying the condition comprises generating an electric field.

33. A method according to claim 23, wherein said applying the condition comprises generating a magnetic field.

* * * * *